(12) United States Patent
Nottelmann et al.

(10) Patent No.: US 12,041,755 B2
(45) Date of Patent: *Jul. 16, 2024

(54) POWER SEMICONDUCTOR MODULE ARRANGEMENT AND METHOD FOR PRODUCING A POWER SEMICONDUCTOR MODULE ARRANGEMENT

(71) Applicant: Infineon Technologies AG, Neubiberg (DE)

(72) Inventors: Regina Nottelmann, Bad Sassendorf (DE); Andre Arens, Rüthen (DE); Michael Ebli, Bad Sassendorf (DE); Alexander Herbrandt, Soest (DE); Ulrich Michael Georg Schwarzer, Warstein (DE); Alparslan Takkac, Meschede (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 18/082,795

(22) Filed: Dec. 16, 2022

(65) Prior Publication Data

US 2023/0124688 A1 Apr. 20, 2023

Related U.S. Application Data

(63) Continuation of application No. 17/346,841, filed on Jun. 14, 2021, now Pat. No. 11,533,824.

(30) Foreign Application Priority Data

Jun. 22, 2020 (EP) .................................. 20181421

(51) Int. Cl.
*H05K 7/20* (2006.01)
*H05K 1/18* (2006.01)
*H05K 3/30* (2006.01)

(52) U.S. Cl.
CPC ........... *H05K 7/2039* (2013.01); *H05K 1/181* (2013.01); *H05K 3/303* (2013.01)

(58) Field of Classification Search
CPC .................................................... H05K 7/2039
See application file for complete search history.

(56) References Cited

U.S. PATENT DOCUMENTS

| 8,514,579 B2* | 8/2013 | Stolze | H02M 7/003 |
| | | | 257/691 |
| 2007/0272976 A1* | 11/2007 | Popp | H01L 25/16 |
| | | | 257/E25.029 |

(Continued)

FOREIGN PATENT DOCUMENTS

| DE | 102006008807 A1 | 9/2007 |
| DE | 102010022562 A1 | 12/2011 |
| DE | 102015112979 A1 | 3/2016 |

*Primary Examiner* — Sherman Ng
(74) *Attorney, Agent, or Firm* — Murphy, Bilak & Homiller, PLLC

(57) ABSTRACT

A method for producing a power semiconductor module arrangement includes: arranging at least one semiconductor substrate in a housing, each semiconductor substrate including a first metallization layer attached to a dielectric insulation layer, the housing including a through hole extending through a component of the housing; inserting a fastener into the through hole such that an upper portion of the fastener is not inserted into the through hole; arranging a printed circuit board on the housing; arranging the housing on a mounting surface, the mounting surface comprising a hole, wherein the housing is arranged on the mounting surface such that the through hole is aligned with the hole in the mounting surface; and exerting a force on the printed circuit board such that the force causes the fastener to be pressed into the hole in the mounting surface so as to secure the housing to the mounting surface.

20 Claims, 4 Drawing Sheets

(56) References Cited

U.S. PATENT DOCUMENTS

| | | | |
|---|---|---|---|
| 2009/0021916 A1* | 1/2009 | Stolze | H01L 23/48 361/709 |
| 2010/0127371 A1* | 5/2010 | Tschirbs | H05K 1/142 257/E23.083 |
| 2010/0252922 A1* | 10/2010 | Bayerer | H01L 25/072 156/60 |
| 2014/0035118 A1* | 2/2014 | Bayerer | H01L 25/072 438/122 |
| 2014/0204536 A1* | 7/2014 | Jones | H05K 7/1432 361/728 |
| 2016/0351460 A1* | 12/2016 | Wan | H01L 23/16 |
| 2016/0352244 A1* | 12/2016 | Cheng | H01L 23/3735 |
| 2017/0316992 A1* | 11/2017 | Spann | H01L 23/08 |
| 2018/0184538 A1* | 6/2018 | Bayerer | H01L 23/24 |
| 2018/0302999 A1* | 10/2018 | Söhner | H05K 5/0082 |
| 2019/0304857 A1 | 10/2019 | Spann | |
| 2019/0364656 A1* | 11/2019 | Robin | H05K 7/20472 |

\* cited by examiner

POWER SEMICONDUCTOR MODULE ARRANGEMENT AND METHOD FOR PRODUCING A POWER SEMICONDUCTOR MODULE ARRANGEMENT

TECHNICAL FIELD

The instant disclosure relates to a power semiconductor module, and a method for producing such power semiconductor module.

BACKGROUND

Power semiconductor modules often include a semiconductor substrate arranged in a housing. A semiconductor arrangement including a plurality of controllable semiconductor elements (e.g., two IGBTs in a half-bridge configuration) may be arranged on the substrate. The substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. The second metallization layer may be attached to a heat sink, to a base plate or to a ground surface of the housing. The controllable semiconductor devices are usually mounted to the semiconductor substrate by soldering or sintering techniques. One or more contact elements, which allow for contacting such a semiconductor arrangement from outside the housing, are usually provided. Power semiconductor modules are known, where the contact elements are arranged on the substrate and protrude in a direction that is essentially perpendicular to the main surface of the substrate through a cover of the housing. The section of the contact elements which protrudes out of the housing may be mechanically and electrically coupled to a printed circuit board. Usually, the printed circuit board comprises through holes and the contact elements are inserted through the respective through holes.

In order to attach the housing with the semiconductor substrate arranged therein to a heat sink, the housing (or suitable projections attached to the housing), as well as the heat sink may comprise threaded holes. A screw may be inserted through these threaded holes, thereby fixing the housing with the printed circuit board attached thereto on the heat sink. A through hole in the printed circuit is further necessary to be able to fix the screw in the threaded hole with an appropriate tool (e.g., screwdriver). Providing a through hole in the printed circuit board, however, has the disadvantage that certain areas of the printed circuit board are lost which cannot be used to provide conducting paths. The printed circuit board, therefore, needs to be larger or needs to have more layers of conducting paths which increases the overall costs of the arrangement.

There is a need for a semiconductor module arrangement that may be mounted to a heat sink, wherein a printed circuit board of the arrangement is as small and cheap as possible.

SUMMARY

A method for producing a power semiconductor module arrangement includes arranging at least one semiconductor substrate in a housing, each semiconductor substrate including a dielectric insulation layer and a first metallization layer attached to the dielectric insulation layer, and the housing including at least one through hole extending through a component of the housing, inserting at least one pin or bolt into the at least one through hole, wherein an upper end of the pin or bolt is not inserted into the through hole, arranging a printed circuit board on the housing, arranging the housing on a heat sink, the heat sink including at least one hole, wherein the housing is arranged on the heat sink such that each of the at least one through hole is aligned with one of the at least one hole in the heat sink, and using a first pressing tool, thereby exerting a force on at least one defined contact area of the printed circuit board and pressing each of the at least one pin or bolt into the respective hole in the heat sink, wherein each of the at least one defined contact area is arranged directly above one of the at least one pin or bolt.

A power semiconductor module arrangement includes a housing with at least one through hole extending through a component of the housing, at least one semiconductor substrate arranged in the housing and including a dielectric insulation layer and a first metallization layer attached to the dielectric insulation layer, a printed circuit board arranged outside of the housing, a heat sink including at least one hole, wherein the housing is arranged on the heat sink such that each of the at least one through hole is aligned with one of at least one hole in the heat sink, and at least one pin or bolt, wherein each of the at least one pin or bolt extends through one of the at least one through hole and into the corresponding hole in the heat sink, and wherein an upper end of the pin or bolt is not inserted into the through hole, wherein each of the at least one pin or bolt is arranged below one of at least one defined contact area of the printed circuit board, wherein the at least one defined contact area is configured to be exposed to a pressure exerted by a first pressing tool.

The invention may be better understood with reference to the following drawings and the description. The components in the figures are not necessarily to scale, emphasis instead being placed upon illustrating the principles of the invention. Moreover, in the figures, like reference numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
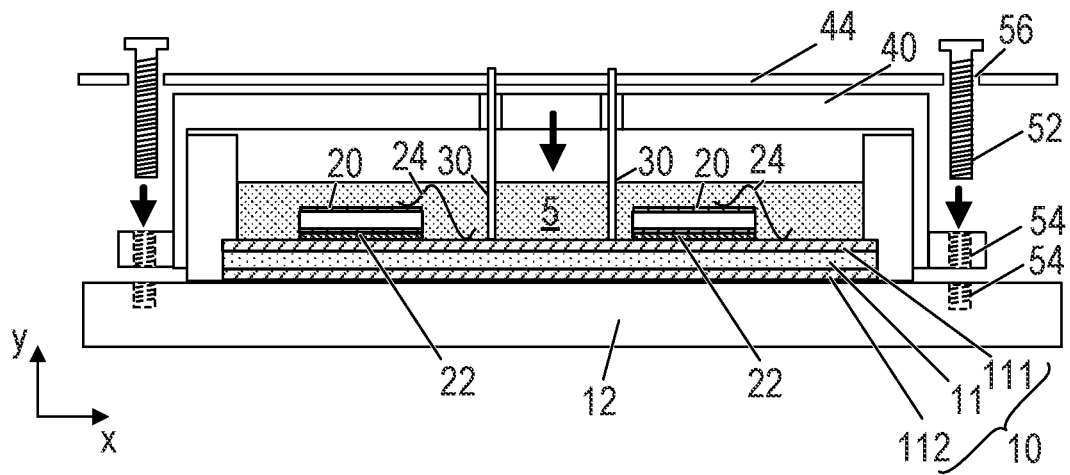
FIG. 1 is a cross-sectional view of a power semiconductor module arrangement.

Referring to FIG. 1, a cross-sectional view of a power semiconductor module is illustrated. The power semiconductor module includes a housing and a semiconductor substrate 10. The semiconductor substrate 10 includes a dielectric insulation layer 11, a (structured) first metallization layer 111 attached to the dielectric insulation layer 11, and a second (structured) metallization layer 112 attached to the dielectric insulation layer 11. The dielectric insulation layer 11 is disposed between the first and second metallization layers 111, 112. It is, however, also possible that the semiconductor substrate 10 only comprises a first metallization layer 111, while the second metallization layer 112 is omitted.

Each of the first and second metallization layers 111, 112 may consist of or include one of the following materials: copper; a copper alloy; aluminum; an aluminum alloy; any other metal or alloy that remains solid during the operation of the power semiconductor module arrangement. The semiconductor substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 10 may be, e.g., a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $Si_2O$, $Al_2O_3$, AlN, or BN and may have a diameter of between about 1 μm and about 50 μm. The substrate 10 may also be a conventional printed circuit board (PCB) having a non-ceramic dielectric insulation layer 11. For instance, a non-ceramic dielectric insulation layer 11 may consist of or include a cured resin.

The semiconductor substrate 10 is arranged in a housing 40. The housing 40 illustrated in FIG. 12 only comprises sidewalls and a cover, but no ground surface. Instead, the semiconductor substrate 10 forms a ground surface of the housing. This, however, is only an example. The housing 40 may also comprise a ground surface such that the housing 40 forms a closed casing. The semiconductor substrate 10 may be arranged on a heat sink 12, for example. It is, however, also possible, that the power semiconductor module further comprises an additional base plate (not illustrated in the Figures) arranged between the semiconductor substrate 10 and the heat sink 12. Such a base plate could form a ground surface of the housing 40, for example. In FIG. 1, only one semiconductor substrate 10 is illustrated. In some power semiconductor module arrangements, more than one semiconductor substrate 10 may be arranged in a single housing 40. The housing 40 may include a metal or a metal alloy, for example. It is, however, also possible that the housing 40 comprises an electrically insulating material such as a plastic or ceramic material, for example. The housing 40 may also include a liquid crystal polymer, for example.

One or more semiconductor bodies 20 may be arranged on the semiconductor substrate 10. Each of the semiconductor bodies 20 arranged on the semiconductor substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable controllable semiconductor element.

The one or more semiconductor bodies 20 may form a semiconductor arrangement on the semiconductor substrate 10. In FIG. 1, only two semiconductor bodies 20 are exemplarily illustrated. The second metallization layer 112 of the semiconductor substrate 10 in FIG. 1 is a continuous layer. The first metallization layer 111 of the example in FIG. 1 is also a continuous layer. However, the first metallization layer 111, or the second metallization layer 112 or both may also be structured layers. "Structured layer" means that, e.g., the respective metallization layer 111, 112 is not a continuous layer, but includes recesses between different sections of the layer. Different semiconductor bodies 20 may be mounted to the same or to different sections of the first metallization layer 111. Different sections of the first metallization layer 111 may have no electrical connection or may be electrically connected to one or more other sections using, e.g., bonding wires. Electrical connections may also include connection plates or conductor rails, for example, to name just a few examples. The one or more semiconductor bodies 20 may be electrically and mechanically connected to the semiconductor substrate 10 by an electrically conductive connection layer 22. Such an electrically conductive connection layer 22 may be a solder layer, a layer of an electrically conductive adhesive, or a layer of a sintered metal powder, e.g., a sintered silver powder, for example. The semiconductor bodies 20 may further be electrically connected to the semiconductor substrate 10 by means of electrical connections 24 such as, e.g., bonding wires, or bonding ribbons.

The power semiconductor module further includes terminal elements 30. The terminal elements 30 are electrically connected to the semiconductor substrate 10, e.g., to the first metallization layer 111 of the semiconductor substrate 10, and form a contact element which provides an electrical connection between the inside and the outside of the housing 40. A first end of the terminal elements 30 may be electrically and mechanically connected to the first metallization layer 111 by an electrically conductive connection layer (not specifically illustrated). Such an electrically conductive connection layer may be a solder layer, a layer of an electrically conductive adhesive, or a layer of a sintered metal powder, e.g., a sintered silver powder, for example. A second end of the terminal elements 30 protrudes out of the housing 40 to allow the contact element to be electrically contacted from the outside. The cover of the housing 40 may comprise openings through which the terminal elements 30 may protrude such that their first side is inside the housing 40 and their second side is outside the housing 40. The terminal elements 30 may protrude vertically out of the housing 40 when the housing 40 is arranged to surround the semiconductor substrate 10.

A power semiconductor module may further include a casting compound 5. The casting compound 5 may consist of or include a silicone gel or may be a rigid molding compound, for example. The casting compound 5 may partly fill the interior of the housing 40, thereby covering the semiconductor substrate 10 and the semiconductor bodies 20, and any other components and electrical connections 24 that are arranged on the semiconductor substrate 10. Electrical connections 24 such as, e.g., bonding wires or bonding ribbons, may electrically couple the semiconductor bodies 20 to the first metallization layer 111, to other semiconductor bodies 20, or to any other components that may be arranged inside the housing. The terminal elements 30 may be partly embedded in the casting compound 5. At least the second end of the terminal elements 30, however, may not be covered by the casting compound 5 and may protrude from the casting compound 5. The casting compound 5 is configured to protect the components and electrical connections inside the power semiconductor module arrangement, in particular inside the housing 40, from certain environmental conditions, mechanical damage and insulation faults.

The semiconductor substrate 10 may be connected to the heat sink 12 by means of a connection layer (not specifically illustrated in FIG. 1). Such a connection layer may be a solder layer, a layer of an adhesive material, or a layer of a sintered metal powder, e.g., a sintered silver powder, for example. Any other kind of electrically conducting or non-conducting connection layer is also possible.

The sidewalls of the housing 40 generally may be mechanically connected to the semiconductor substrate 10 by means of a joint (not specifically illustrated in the Figures). This joint may be a solder joint, a cold welding joint, or an adhesive joint, for example. Any other suitable joints are also possible to mechanically connect the sidewalls of the housing 40 to the semiconductor substrate, which also provide a suitable seal such that no, or at least less gasses may enter the housing 40. The sidewalls and a ground surface may also be provided as a single piece instead (not specifically illustrated). This means that there are no joints between the sidewalls and the ground surface of the housing 40.

The section of the terminal elements 30 which protrudes out of the housing 40 may be mechanically and electrically coupled to a printed circuit board 44. Usually, the printed circuit board 44 comprises through holes and the terminal elements 30 are inserted through the respective through holes. The printed circuit board 44 may comprise conducting tracks (not specifically illustrated) and a terminal element 30 may be electrically coupled to one or more other terminal elements 30 by means of one or more conducting tracks. In this way, an electrical connection may be provided between different sections of the first metallization layer 111, between different semiconductor bodies 20, and/or between any other components arranged on the semiconductor substrate 10 or on other substrates within the same housing 40. Often, the power semiconductor module with the semiconductor arrangement including the semiconductor bodies 20 and the terminal elements 30 is prefabricated and customers may mount their own customized printed circuit boards 44 to the prefabricated power semiconductor module.

When the semiconductor module arrangement with the semiconductor substrate 10, the housing 40 and the printed circuit board 44 is fully assembled, the arrangement is mounted to the heat sink 12. Commonly, the housing 40 comprises projections with threaded holes 54. The heat sink 12 may also comprise threaded holes 54. Hence, the housing 40 may be attached to the heat sink 12 by means of screws 52 that are inserted into the threaded holes 54.

When the housing is mounted onto the heat sink 12, the printed circuit board 44 is usually already attached to the housing 40. In many cases, a great number of conducting tracks is needed on the printed circuit board 44. Therefore, printed circuit boards 44 are often large in size and/or comprise two or more conducting layers (e.g., multi-layer circuit boards). A cross-sectional area of the printed circuit board 44 is usually larger than the cross-sectional area of the housing 40. The printed circuit board 44, therefore, may significantly protrude over the sidewalls of the housing 40 in a horizontal plane. This, however, makes it difficult to access the threaded holes 54 and the screw 52 in order to mount the housing 40 onto the heat sink 12. For this reason, openings 56 are provided in the printed circuit board 44. Such openings 56 are arranged directly above the respective projections with the through holes 54 and are large enough in diameter to be able to insert a screw 52 into the threaded holes 54 and access the screws 52 with an appropriate tool to tighten the screws 52. Such openings 56, however, require space of the printed circuit board 44 which consequently cannot be used to provide conducting tracks. This further increases the overall size of the printed circuit board 44 and the costs for the overall power semiconductor module arrangement.

Figure 2:
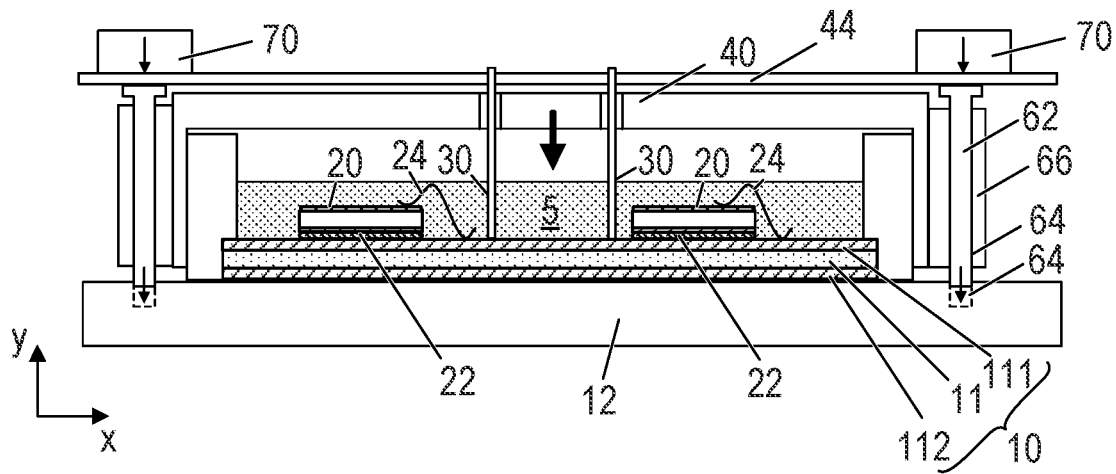
FIG. 2 is a cross-sectional view of a power semiconductor module arrangement according to an example.

Now referring to the example illustrated in FIG. 2, a power semiconductor module is schematically illustrated which does not require any openings in the printed circuit board 44 in order to be able to mount the housing 40 onto the heat sink 12. Instead of screws 52 as described with respect to FIG. 1 above, the arrangement illustrated in FIG. 2 comprises pins or bolts, i.e., press bolts, 62 for mounting the housing 40 on the heat sink 12. The pins or bolts 62 may be inserted into through holes 64 that are provided in a component of the housing 40. The component may be a sidewall of the housing 40, for example. Alternatively, the component may comprise a projection 66 coupled to the sidewalls of the housing 40, for example. Such a projection 66 may be integrally formed with the sidewalls of the housing 40, or may be attached to the sidewalls in any suitable way, e.g., by means of an adhesive layer. The pins or bolts 62 may be inserted into the through holes 64 provided in the component of the housing 40 before mounting the printed circuit board 44 onto the housing 40. At this point, the through holes 64 are still easily accessible. The housing 40 may then be easily mounted onto the heat sink 12 after mounting the printed circuit board 44 to the housing 40. The heat sink 12 also comprises holes 64. The pins or bolts 62 may be pushed into the holes 64 provided in the heat sink 12. No rotary motion of the pins or bolts 62 is required. A diameter of the holes 64 in the heat sink 12 may be equal to or only slightly larger than a diameter of the pins or bolts 62. Each of the at least one pin or bolt 62 is pressed into a respective hole 64 in the heat sink 12 by means of a pressing power.

The through holes 64 of the housing 40 with the pins or bolts 62 inserted therein may be arranged directly underneath defined contact areas of the printed circuit board 44. A first pressing tool 70 may be used to exert a force on the at least one defined contact area of the printed circuit board 44, thereby pressing each of the at least one pin or bolt 62 into the respective hole 64 in the heat sink 12. The housing 40 may be arranged on the heat sink 12 such that the through holes 64 in the component of the housing 40 are aligned with the holes 64 provided in the heat sink 12. The pins or bolts 62 may have a length in a vertical direction y that is long enough to allow the pin or bolt 62 to be inserted into the hole 64 in the heat sink 12 and still being in direct contact with the printed circuit board 44, as is schematically illustrated in FIG. 3 which illustrates that arrangement of FIG. 2 in a fully assembled state.

The pins or bolts 62 may each comprise a main body and a head, the head being larger in diameter than the main body in order to prevent the pins or bolts 62 from falling through the through holes 64 of the housing 40. An upper end of the pins or bolts 62 which is the end directed towards the printed circuit board 44, therefore, always remains outside the through hole 64 in the component of the housing 40. The larger the diameter of the head, the more will any pressure exerted on the pin or bolt 62 be distributed. That is, the diameter of the defined contact areas of the printed circuit board 44 will become larger if the diameter of the heads of the pins or bolts 62 gets larger. The pressure that needs to be applied to the printed circuit board 44 per unit area therefore decreases, which reduces the risk of damage to the printed circuit board 44. The diameter of the first pressing tool 70 may be chosen according to the diameter of the head, for example. Even if a pressure is exerted directly to the printed circuit board 44, conducting tracks may also be provided in the defined contact areas. There is no need to keep the contact areas of the printed circuit board 44 free of conducting tracks. In order to reduce the risk of damaging any conducting tracks arranged in the contact areas, the conducting tracks may be implemented by depositing thicker layers of electrically conducting material when forming the conducting tracks, for example.

The pins or bolts 62 may comprise a material that does not deform or shrink when exposed to high temperatures. During the use of the power semiconductor module arrangement usually heat is generated by the semiconductor arrangement arranged on the at least one semiconductor substrate 10. This heat is transferred to the heat sink 12 to avoid an overheating of the components. The pins or bolts 62 should be firmly pressed into the holes 64 of the heat sink 12 at any time in order to avoid the housing falling off the heat sink 12. Therefore, the pins or bolts 62 may be made of a material or a mix of materials that keeps its shape even at temperatures of above 50° C., or above 100° C., for example. In this way, the diameter of the pins or bolts 62 remains essentially constant even at high temperatures and remains firmly pressed in the holes 62.

Figure 3:
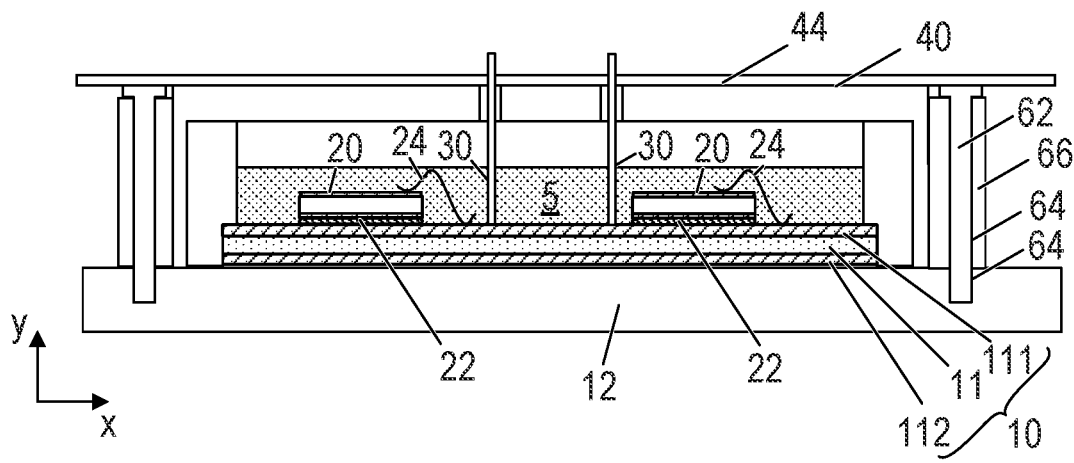
FIG. 3 is a cross-sectional view of a power semiconductor module arrangement according to another example.
Figure 4:
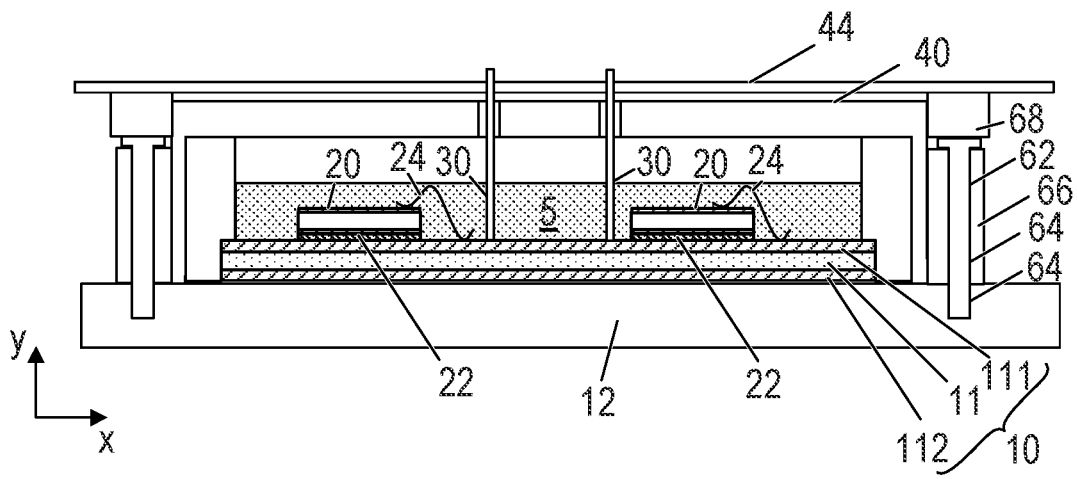
FIG. 4 is a cross-sectional view of a power semiconductor module arrangement according to another example.

In the example illustrated in FIGS. 2 and 3, the pins or bolts 62 are in direct contact with the printed circuit board 44. This, however, is only an example. As is schematically illustrated in the example of FIG. 4, a spacer element 68 may be arranged between the upper end of each of the at least one pin or bolt 62 and the printed circuit board 44, and below the respective contact area of the printed circuit board 44. The overall length of the pins or bolts 62 in the vertical direction may be reduced in this way. The spacer elements 68 may be separate parts or may be attached to the housing 40, for example. The spacer elements 68 are configured to span and bypass a distance between the pins or bolts 62 and the printed circuit board 44. The pressure exerted onto the printed circuit board 44 by the first pressing tool 70 is then transferred to the spacer elements 68 and from there to the pins or bolts 62 which are then pushed into the holes 64 in the heat sink 12. However, whether the arrangement comprises spacer elements 68 (see FIG. 4) or not (see FIGS. 2 and 3), the press-in force is always applied via the printed circuit board 44 and transferred directly or indirectly to the pins or bolts 62.

In the examples illustrated in FIGS. 2, 3 and 4, the holes 64 in the heat sink 12 have a depth in the vertical direction y that is less than a thickness of the heat sink 12 in the same direction y. This, however, is only an example. As is exemplarily illustrated in FIG. 5, the holes 64 in the heat sink 12 may also be through holes that have a depth in the vertical direction y that equals the thickness of the heat sink 12 in the same direction y. In this way, the pins or bolts 62 are accessible from a bottom side of the power semiconductor module arrangement, wherein the bottom side is the side of the power semiconductor module arrangement on which the heat sink 12 is arranged. If the pins or bolts 62 are accessible from the bottom side, they may be pushed out of the holes 64 in the heat sink 12 in order to remove the housing 40 from the heat sink 12, if necessary. A special removing tool (not specifically illustrated) may be used, for example Such a removing tool may comprise a pin, for example, that has a diameter that is less than the diameter of the hole 64. In this way, a force may be exerted on the pins or bolts 62 from the bottom side, and the removing tool may be inserted into the holes 64 from the bottom side in order to completely push the pins or bolts 62 out of the holes 64.

Figure 6:
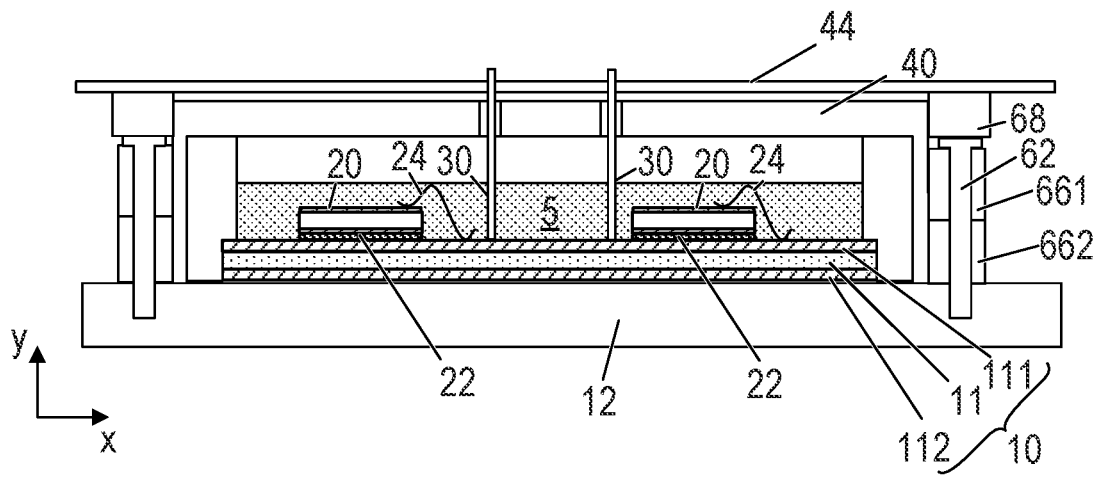
FIG. 6 is a cross-sectional view of a power semiconductor module arrangement according to another example.

Now referring to FIG. 6, an elastic or springy element 661 may be arranged between the component 66, 662, e.g., the projection, of the housing 40 and the printed circuit board 44. A head of the pins or bolts 62 may be arranged between the elastic or springy element 661 and the printed circuit board 44. Each elastic or springy element 661 may comprise a through hole 64. The at least one elastic or springy element 661 may be arranged on the component 66, 662 of the housing 40 such that the through hole 64 of the elastic or springy element 661 aligns with the through hole 64 in the respective component 66, 662. The elastic or springy element 661 may be configured to limit a force that is applied to the heat sink 12. The elastic or springy element 661 may remain in its original shape as long as a pressure exerted on the elastic or springy element 661 is below a defined threshold. If the pressure exceeds the threshold, the elastic or springy element 661 deforms or is compressed.

Figure 5:
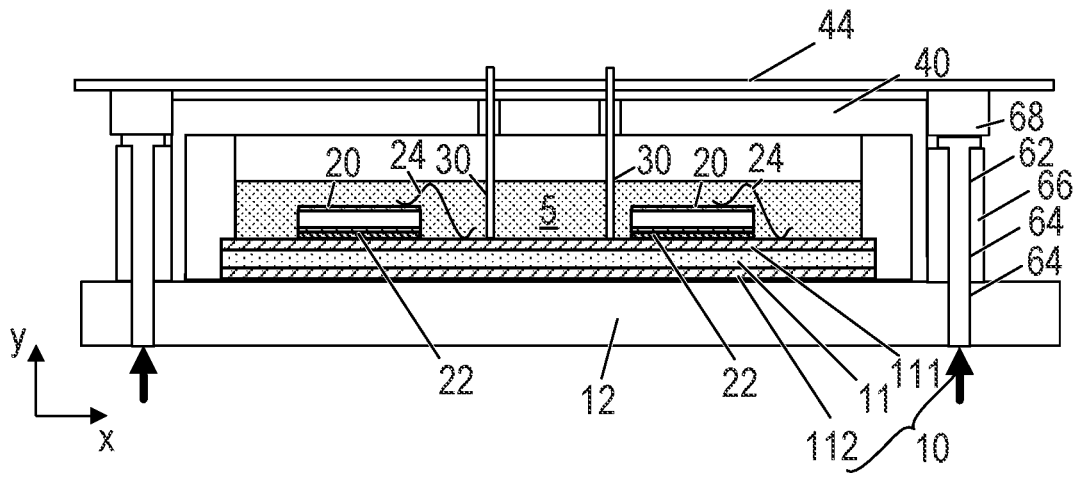
FIG. 5 is a cross-sectional view of a power semiconductor module arrangement according to another example.

In the examples illustrated in FIGS. 5 and 6, the arrangement comprises a spacer element 68 as has been described with respect to FIG. 4. The spacer elements 68 in these examples, however, may also be omitted. Even further, the through holes 64 in the heat sink 12 as described with respect to FIG. 5 may be present in any of the other illustrated examples.

When using pins or bolts 62 as has been described with respect to FIGS. 2 to 6 above, less time may be needed to perform the actual mounting process as compared to the arrangement comprising screws 52, as screwing in the screws 52 generally needs more time than pushing in the pins or bolts 62.

Figure 7A:
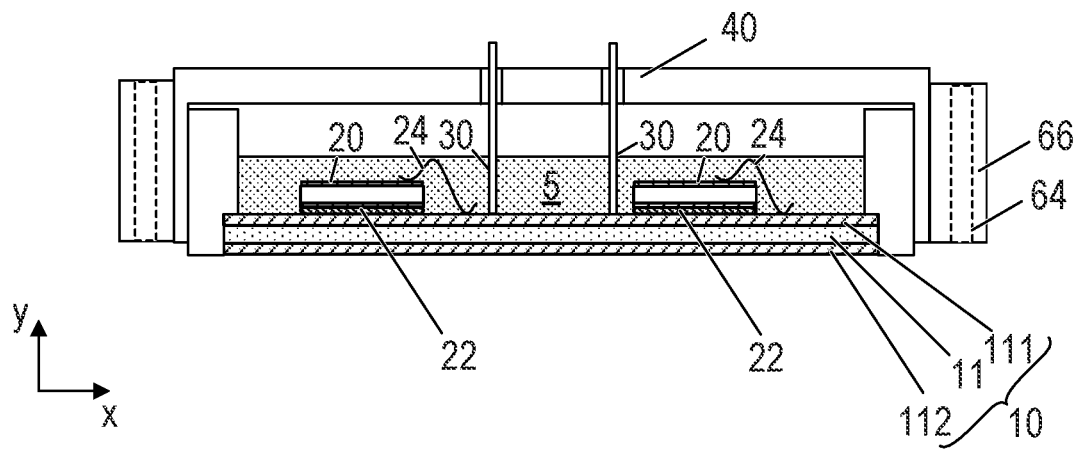
FIGS. 7A to 7D schematically illustrate a method for producing a power semiconductor module arrangement.
Figure 7B:
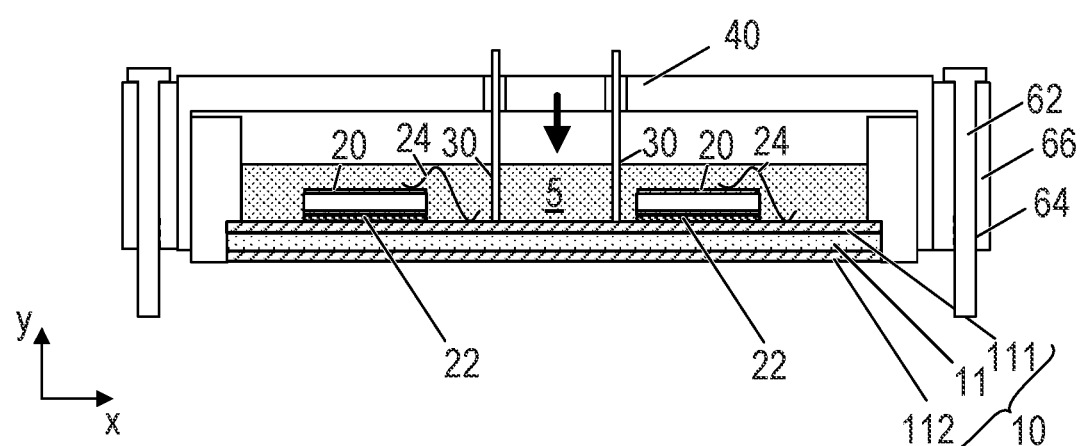
Figure 7C:
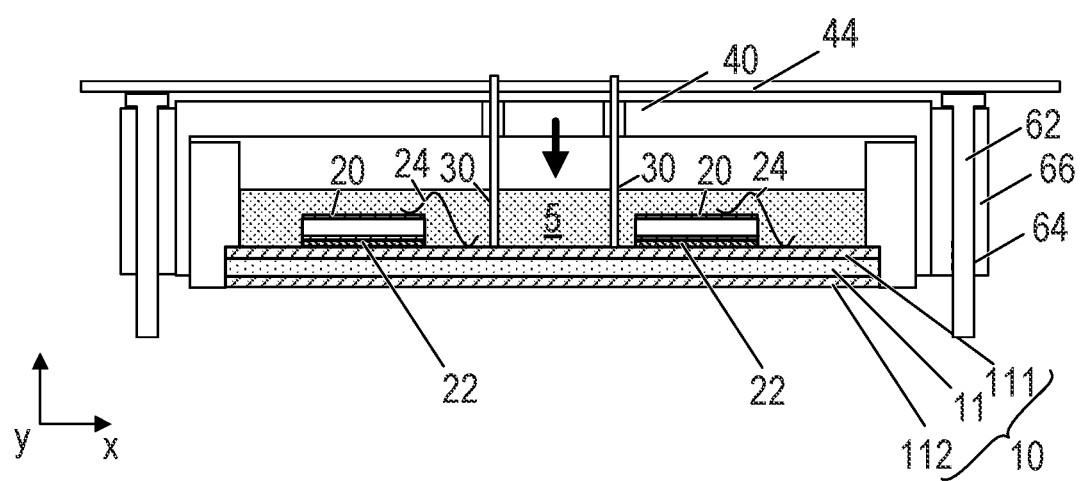
Figure 7D:
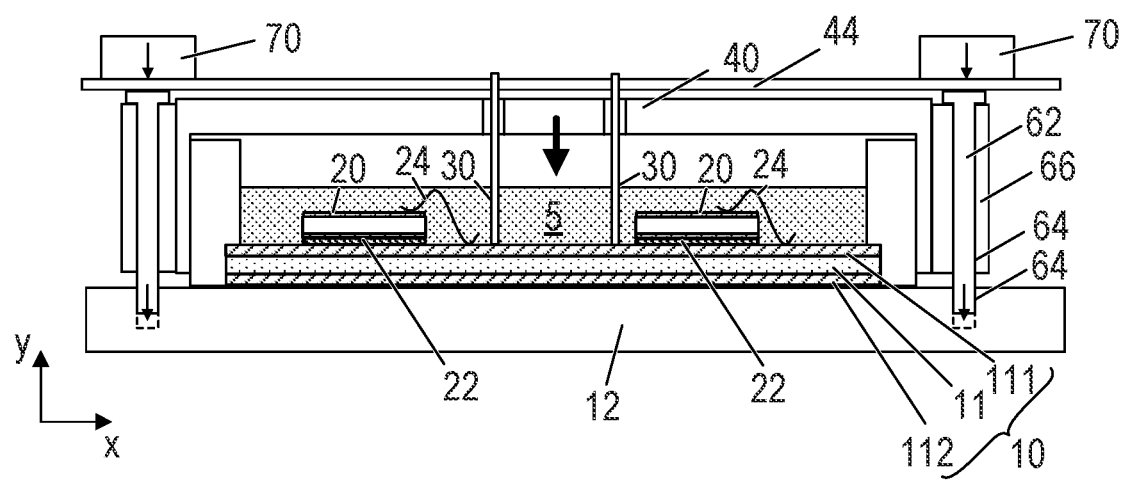

Now referring to FIGS. 7A through 7D, a method for producing a power semiconductor module arrangement is exemplarily illustrated. Referring to FIG. 7A, the method may comprise arranging at least one semiconductor substrate 10 in a housing 40. Each semiconductor substrate 10 may comprise a dielectric insulation layer 11 and a first metallization layer 111 attached to the dielectric insulation layer 11. The housing 40 may comprise at least one through hole 64 extending through a component 66, 662 of the housing 40. Referring to FIG. 7B, the method further comprises inserting at least one pin or bolt 62 into the at least one through hole 64, wherein an upper end of the pin or bolt 62 is not inserted into the through hole 64. Subsequently, as illustrated in FIG. 7C, a printed circuit board 44 is arranged on the housing 40. Now referring to FIG. 7D, the method further comprises arranging the housing 40 on a heat sink 12, the heat sink 12 comprising at least one hole 64, wherein the housing 40 is arranged on the heat sink 12 such that each of the at least one through hole 64 is aligned with one of the at least one hole 64 in the heat sink 12. Using a first pressing tool 70, a force is exerted on at least one defined contact area of the printed circuit board 44. Thereby, each of the at least one pin or bolt 62 is pressed into the respective hole 64 in the heat sink 12, wherein each of the at least one defined contact area is arranged directly above one of the at least one pin or bolt 62.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a power semiconductor module arrangement, the method comprising:
    arranging at least one semiconductor substrate in a housing, each semiconductor substrate comprising a dielectric insulation layer and a first metallization layer attached to the dielectric insulation layer, and the housing comprising a through hole extending through a component of the housing;
    inserting a fastener into the through hole such that an upper portion of the fastener is not inserted into the through hole;
    after inserting the fastener into the through hole, arranging a printed circuit board on the housing such that the fastener is not inserted through the printed circuit board;
    arranging the housing on a mounting surface, the mounting surface comprising a hole, wherein the housing is arranged on the mounting surface such that the through hole is aligned with the hole in the mounting surface; and
    exerting a force on the printed circuit board such that the force causes the fastener to be pressed into the hole in the mounting surface so as to secure the housing to the mounting surface.

2. The method of claim 1, further comprising:
    arranging each of at least one electrically conducting terminal element on one of the at least one semiconductor substrate so as to electrically and mechanically couple a first end of each of the at least one terminal element to the respective semiconductor substrate,
    wherein arranging the printed circuit board on the housing comprises electrically and mechanically coupling the printed circuit board to a second end of each of the at least one terminal element.

3. The method of claim 1, further comprising arranging a spacer element between the upper portion of the fastener and the printed circuit board.

4. The method of claim 1, wherein the fastener is pressed into the hole in the mounting surface without experiencing any rotary motion.

5. The method of claim 1, further comprising:
    arranging an elastic or springy element on the component of the housing, the elastic or springy element comprising a through hole,
    wherein arranging the elastic or springy element on the component of the housing comprises aligning the through hole of the elastic or springy element with the through hole in the component of the housing, and
    wherein the elastic or springy element remains in an original form if a pressure exerted on the elastic or springy element is below a defined threshold, and is deformed or compressed if the pressure exceeds the defined threshold.

6. The method of claim 1, wherein the fastener comprises a pin or a bolt.

7. The method of claim 1, wherein exerting the force on the printed circuit board comprises pressing a defined contact area of the printed circuit board, the defined contact area being aligned with the through hole in a direction along which the force is exerted.

8. The method of claim 1, wherein the mounting surface comprises a heat sink.

9. The method of claim 1, wherein the force is exerted using a pressing tool.

10. The method of claim 1, further comprising:
    inserting a second fastener into a second through hole in a second housing component of the housing such that an upper portion of the second fastener is not inserted into the second through hole;
    while arranging the housing on the mounting surface, aligning the second through hole with a second hole in the mounting surface; and
    exerting a second force on the printed circuit board such that the second force causes the second fastener to be pressed into the second hole in the mounting surface so as to further secure the housing to the mounting surface.

11. The method of claim 10, wherein the forces are exerted on the printed circuit board simultaneously.

12. A power semiconductor module arrangement, comprising:
    a housing with at least one through hole extending through a component of the housing;
    at least one semiconductor substrate arranged in the housing and comprising a dielectric insulation layer and a first metallization layer attached to the dielectric insulation layer;
    a printed circuit board arranged outside of the housing;
    a mounting surface comprising a hole, wherein the housing is arranged on the mounting surface such that the through hole is aligned with the hole in the mounting surface; and
    a fastener extending through the through hole and into the hole in the mounting surface such that an upper portion of the fastener is not inserted into the through hole,
    wherein the entire fastener is arranged below a defined contact area of the printed circuit board,
    wherein the defined contact area is configured to be exposed to a force such that the fastener is arranged so as to be pressed into the hole in the mounting surface upon exertion of the force.

13. The power semiconductor module arrangement of claim 12, further comprising at least one electrically conducting terminal element that is electrically and mechanically coupled to one of the at least one semiconductor substrate with a first end, wherein the printed circuit board is electrically and mechanically coupled to a second end of each of the at least one terminal element.

14. The power semiconductor module arrangement of claim 12, further comprising a spacer element between the upper portion of each of the fastener and the printed circuit board, and below the respective defined contact area of the printed circuit board.

15. The power semiconductor module arrangement of claim 12, further comprising an elastic or springy element arranged on the component of the housing, wherein the elastic or springy element comprises a through hole, wherein the through hole of the elastic or springy element is aligned with the through hole in the component of the housing, and wherein the fastener extends through the through hole of the elastic or springy element, through the through hole, and into the hole in the mounting surface.

16. The power semiconductor module arrangement of claim 15, wherein the elastic or springy element is configured to deform when a pressure applied to the elastic or springy element exceeds a predefined threshold.

17. The power semiconductor module arrangement of claim 12, wherein the hole in the mounting surface is a through hole that extends from an upper surface of the mounting surface to a bottom surface opposite the upper surface, wherein the fastener extends from the upper surface towards the printed circuit board, and wherein the fastener is accessible from the bottom surface.

18. The power semiconductor module arrangement of claim 12, wherein the fastener comprises a main body and a head at the upper end of the main body, and wherein a cross-sectional area of the head is larger than a cross-sectional area of the main body.

19. The power semiconductor module arrangement of claim 12, wherein the mounting surface comprises a heat sink.

20. The power semiconductor module arrangement of claim 12, further comprising:
    a second through hole extending through a second housing component of the housing;
    a second hole in the mounting surface; and
    a second fastener extending through the second through hole and into the second hole in the mounting surface such that an upper portion of the second fastener is not inserted into the second through hole,
    wherein the second fastener is arranged below a second defined contact area of the printed circuit board,
    wherein the second defined contact area is configured to be exposed to a second force such that the second fastener is arranged so as to be pressed into the hole in the mounting surface upon exertion of the second force.

* * * * *